United States Patent
Nagashima

(10) Patent No.: US 7,643,362 B2
(45) Date of Patent: Jan. 5, 2010

(54) SEMICONDUCTOR MEMORY DEVICE IN WHICH REDUNDANCY (RD) OF ADJACENT COLUMN IS AUTOMATICALLY REPAIRED

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 11/962,834

(22) Filed: Dec. 21, 2007

(65) Prior Publication Data
US 2008/0158961 A1 Jul. 3, 2008

(30) Foreign Application Priority Data
Dec. 27, 2006 (JP) .............................. 2006-352816

(51) Int. Cl.
*G11C 7/00* (2006.01)
(52) U.S. Cl. ................... 365/200; 365/230.06
(58) Field of Classification Search ................. 365/200, 365/230.06
See application file for complete search history.

(56) References Cited

U.S. PATENT DOCUMENTS

| | | | |
|---|---|---|---|
| 6,327,197 B1* | 12/2001 | Kim et al. | 365/200 |
| 6,452,844 B2* | 9/2002 | Koshikawa | 365/200 |
| 6,714,466 B2 | 3/2004 | Park et al. | |
| 6,735,727 B1 | 5/2004 | Lee | |
| 7,079,432 B2* | 7/2006 | Kato et al. | 365/200 |
| 7,170,802 B2 | 1/2007 | Cernea et al. | |
| 7,362,628 B2* | 4/2008 | Takenaka | 365/200 |
| 2003/0101328 A1* | 5/2003 | Pascucci | 711/219 |
| 2004/0001375 A1* | 1/2004 | Beer | 365/200 |
| 2006/0227621 A1 | 10/2006 | Kasai et al. | |

FOREIGN PATENT DOCUMENTS

JP 2002-269997 9/2002

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A semiconductor memory device includes a memory cell array having a plurality of memory cells, a redundancy cell array having a plurality of redundancy cells, and a detection circuit which detects a bad bit line at an end of a bad column of the memory cell array. The semiconductor memory device further includes a repair circuit which repairs the bad column of the memory cell array by use of the redundancy cell array and repairs an adjacent column which lies adjacent to the bad column on the bad bit line side detected by the detection circuit by use of the redundancy cell array.

18 Claims, 8 Drawing Sheets

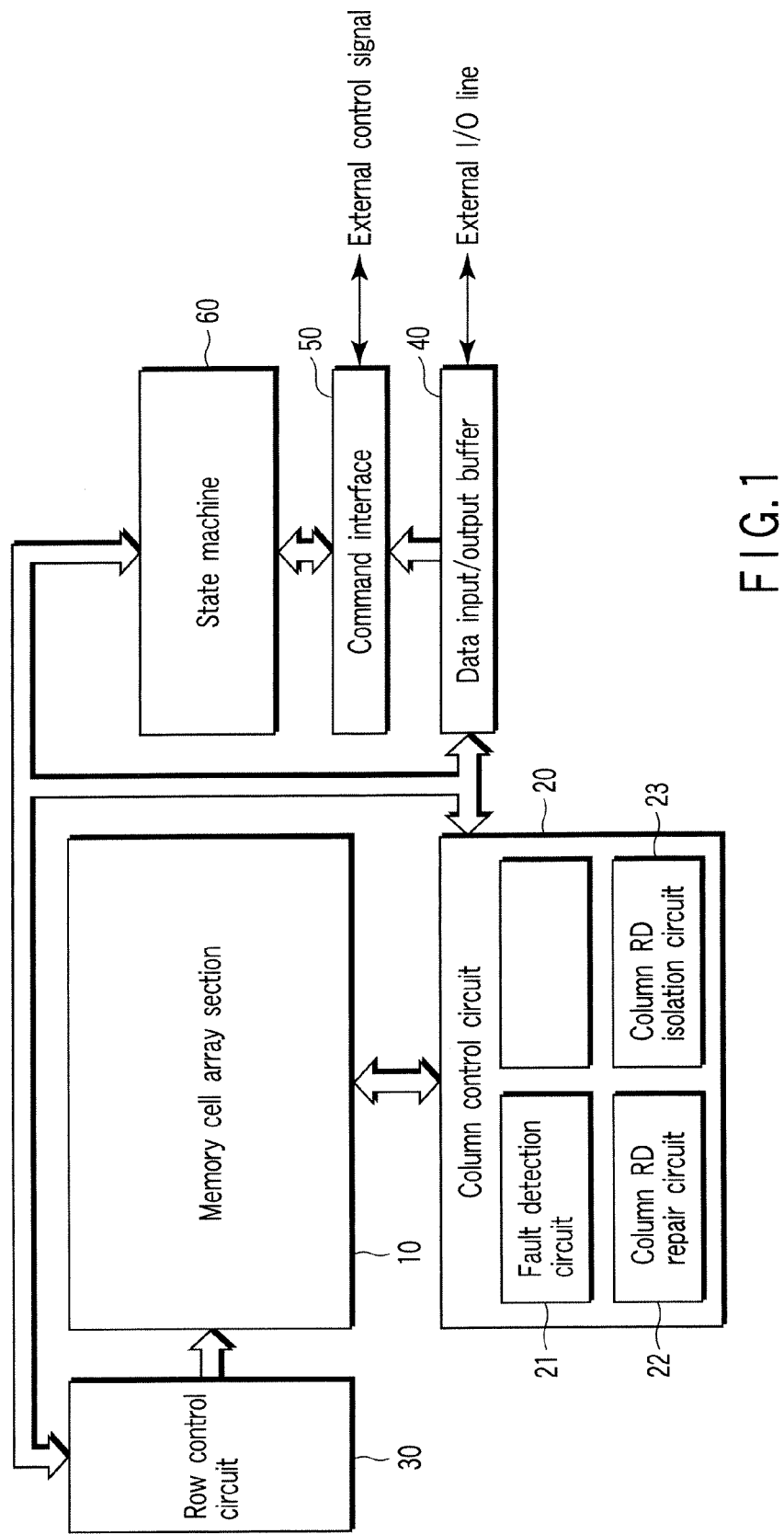
F I G. 1

A0~A11: column address
INDEX: index flag

SEMICONDUCTOR MEMORY DEVICE IN WHICH REDUNDANCY (RD) OF ADJACENT COLUMN IS AUTOMATICALLY REPAIRED

CROSS-REFERENCE TO RELATED APPLICATIONS

This application is based upon and claims the benefit of priority from prior Japanese Patent Application No. 2006-352816, filed Dec. 27, 2006, the entire contents of which are incorporated herein by reference.

BACKGROUND OF THE INVENTION

1. Field of the Invention

This invention relates to a semiconductor memory device, and more particularly, to a NAND flash memory in which the RD of a bad column is repaired by using a BIST (built in self test) function.

2. Description of the Related Art

At present, in a NAND flash memory, a bad column can be repaired by use of a redundancy cell array by using the BIST function (for example, refer to Jpn. Pat. Appln. KOKAI Publication No. 2002-269997). As a result, the simultaneous measurement can be performed for a large number of devices, the test time consumed by the measurement can be reduced and the test cost can be lowered.

However, when a bit line (BL) at the end of the column becomes bad, it is necessary to perform the RD repair process of the adjacent column on the bad bit line side according to an instruction manual. This is because a bit line which lies at the end of the column and is open gives a bad influence on the sense operation at the read time for the adjacent column. Therefore, at present, whether the bit line at the end of the column is open or not is checked according to an input/output (I/O) signal of a tester. If the bit line at the end of the column is open, an adjacent column on the side of the bit line which is open is repaired by use of a redundancy cell array according to an instruction manual by using a tester. If this method is used, it becomes impossible to simultaneously measure a large number of devices and it becomes necessary to use a high-performance tester, and therefore, there occurs a problem that the test time is lengthened and the test cost is raised.

BRIEF SUMMARY OF THE INVENTION

According to a first aspect of the present invention, there is provided a semiconductor memory device which comprises a memory cell array having a plurality of memory cells, a redundancy cell array having a plurality of redundancy cells, a detection circuit which detects a bad bit line at an end of a bad column of the memory cell array, and a repair circuit which repairs the bad column of the memory cell array by use of the redundancy cell array and repairs an adjacent column which lies adjacent to the bad column on the bad bit line side detected by the detection circuit by use of the redundancy cell array.

According to a second aspect of the present invention, there is provided a semiconductor memory device which comprises a memory cell array section including a memory cell array having a plurality of memory cells arranged in column units and a redundancy cell array having a plurality of redundancy cells arranged in column units, a detection circuit which detects a bad bit line at an end of a bad column of the memory cell array, a repair circuit which repairs or replaces the bad column of the memory cell array by the redundancy column of the redundancy cell array and repairs or replaces an adjacent column which lies adjacent to the bad column on the bad bit line side detected by the detection circuit by the redundancy column of the redundancy cell array, and an isolation circuit which electrically isolates the bad redundancy column of the redundancy cell array from the redundancy cell array.

BRIEF DESCRIPTION OF THE SEVERAL VIEWS OF THE DRAWING

FIG. 1 is a block diagram showing an example of the configuration of a semiconductor memory device (NAND flash memory) according to a first embodiment of this invention.

DETAILED DESCRIPTION OF THE INVENTION

Figure 2:
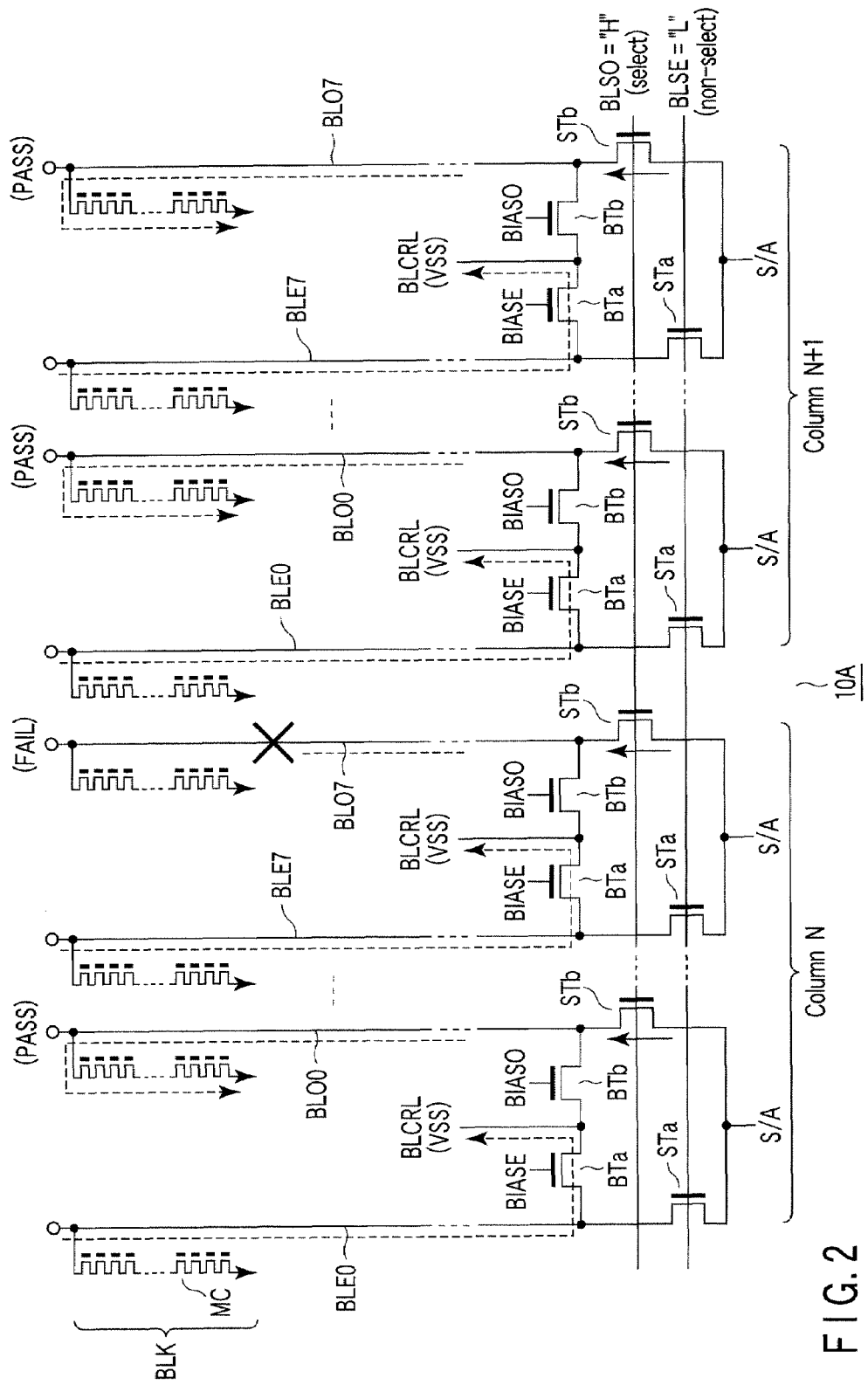
FIG. 2 is a diagram showing an example of the configuration of a memory cell array in the NAND flash memory.

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

FIRST EMBODIMENT

FIG. 1 shows an example of the configuration of a semiconductor memory device according to a first embodiment of this invention. In the present embodiment, a case wherein a NAND flash memory which is a nonvolatile semiconductor memory device is taken as an example is explained.

As shown in FIG. 1, the NAND flash memory includes a memory cell array section 10, column control circuit 20, row control circuit 30, data input/output buffer 40, command interface 50 and state machine 60. The memory cell array section 10 has a plurality of memory cells arranged in a matrix form, for example. Further, the memory cell array section 10 includes a main memory cell array (prime cell array) and a redundancy cell array used to repair a fault when the fault is detected in the main memory cell array.

The column control circuit 20 decodes a column address signal to acquire a column address decode signal and performs the operation of selecting a column selection line in the memory cell array section 10 based on the column address decode signal. The column control circuit 20 is controlled by a state machine 60. The column control circuit 20 includes a fault detection circuit 21, column RD repair circuit 22 and column RD isolation circuit 23. Then, it performs the RD repair operation for a bad column by use of the BIST function under the control of the state machine 60 and the RD repair operation for a column adjacent to the side of a bad bit line when the bit line at the end of the bad column becomes bad.

The row control circuit 30 decodes a row address signal to acquire a row address decode signal and performs the operation of selecting a row selection line in the memory cell array section 10 based on the row address decode signal. The row control circuit 30 is controlled by the state machine 60.

The data input/output buffer 40 holds read data read out from the memory cell array section 10 and transferred via an external input/output (I/O) line and write data to be written into the memory cell array section 10. Further, the data input/output buffer 40 fetches a test command supplied from the exterior (for example, simplified tester) via an external I/O line and outputs the test command to the command interface 50. The data input/output buffer 40 is operated according to an instruction from the state machine 60.

The command interface 50 outputs the test command supplied from the data input/output buffer 40 to the state machine 60 according to an external control signal and outputs a control signal from the state machine 60 to the exterior.

The state machine 60 controls the column control circuit 20, row control circuit 30, data input/output buffer 40 and command interface 50. For example, the state machine 60 causes the column control circuit 20 to perform BIST by the sequence control operation according to the test command from the command interface 50.

In the present embodiment, a plurality of devices (NAND flash memory chips) with the above configuration are formed on the same wafer. The measurements for the plurality of devices are simultaneously performed by use of the simplified tester and BIST.

FIG. 2 shows an example of the configuration of the memory cell array section 10 described above. In this case, the main memory cell array is explained as an example (since the redundancy cell array has substantially the same configuration as the main memory cell array, the details thereof are omitted).

In a memory cell array 10A, a plurality of columns (main columns) N, N+1, . . . are provided (in the case of the redundancy cell array, redundancy columns are provided). A plurality of (in this example, eight) sense amplifiers S/A are prepared for each of the main columns N, N+1, . . . . To each of the sense amplifiers S/A, paired bit lines BLE0 to BLE7 (even) and BLO0 to BLO7 (odd) are connected via select transistors STa and STb, respectively. The gates of the select transistors STa and STb are respectively connected to row selection lines BLSE and BLSO.

Control voltage BLCRL (VSS) is applied to the paired bit lines BLE0 to BLE7 and BLO0 to BLO7 via bias transistors BTa and BTb, respectively. The gates of the bias transistors BTa and BTb are respectively connected to bias selection lines BIASE and BIASO.

Further, a plurality of memory cell blocks BLK are connected to each of the paired bit lines BLE0 to BLE7 and BLO0 to BLO7. Each of the memory cell blocks BLK includes a preset number of memory cells MC. Each memory cell is configured by a MOS (Metal Oxide Semiconductor) transistor with the stacked gate structure having a floating gate (charge storage layer) formed above a semiconductor substrate with a gate insulating film disposed therebetween and a control gate (word line) formed above the floating gate with a gate-gate insulating film disposed therebetween. Adjacent memory cells MC of the preset number of memory cells MC in the column direction of each of the memory cell blocks BLK commonly have a drain region or source region.

In this example, a normal (existing) bit line test (BL Test) method using the BIST is briefly explained.

Figure 3:
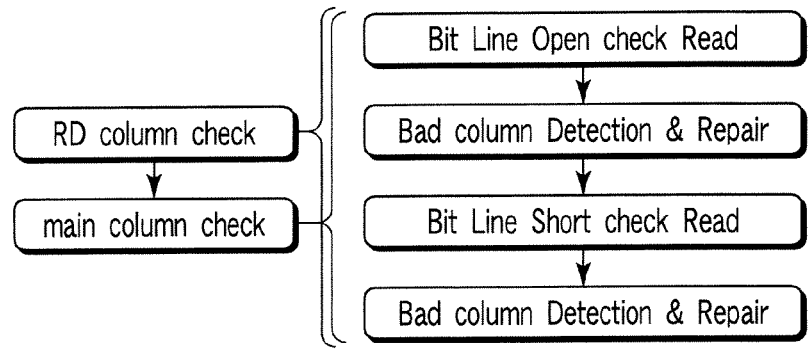
FIG. 3 is a diagram showing one example of a sequence of bit line tests for the NAND flash memory.

FIG. 3 shows one example of a sequence of bit line tests. As shown in FIG. 3, in the bit line test, an operation of checking (RD column check) redundancy columns of the redundancy cell array and an operation of checking (main column check) main columns N, N+1, . . . of the memory cell array 10A are sequentially performed. In each checking operation, a bit line open test and short test are repeatedly performed for each column and a bad column (Bad column) detecting operation and RD repair operation are performed each time.

The bit line open test method is specifically explained below with reference to FIG. 2. In this example, a case wherein a test is made to determine whether each of the bit lines BLE0 to BLE7 and BLO0 to BLO7 of the main columns N, N+1, . . . of the main memory cell array 10A is open or not is explained. For example, when each of the bit lines BLO0 to BLO7 of the main column N is tested, first, address data (column address) of the main column N is set in a column address register (not shown) to select the main column N. In this state, each select transistor STa is set into a non-selected (BLSE="L (Low)") state and each select transistor STb is set into a selected (BLSO="H (High)") state. Then, the memory cell blocks BLK which lie in the remotest portion from the sense amplifiers S/A are selected and the read operation is performed (data of each cell MC is previously erased). The control voltage BLCRL (VSS) is applied to the bit lines BLE0 to BLE7 connected to the cell transistors STa set in the non-selected state via the respective bias transistors BTa (bias selection lines BIASE="H" and BIASO="L").

In the read operation, if each of the bit lines BLO0 to BLO7 is normal, potentials charged on the bit lines BLO0 to BLO7 by the sense amplifiers S/A are discharged via the memory cells MC. Therefore, the read results obtained from the sense amplifiers S/A are all set to "1 (Pass)". However, if any one of the bit lines BLO0 to BLO7 is open (in this example, the bit line BLO7 of the main column N is open as indicated by an X mark in FIG. 2), potential charged on the bit line BLO7 by the corresponding sense amplifier S/A is not discharged via the memory cells MC. Therefore, only the read result obtained from the above sense amplifier S/A is set to "0 (FAIL)".

Likewise, when each of the bit lines BLE0 to BLE7 of the main column N is tested, each select transistor STa is set into a selected (BLSE="H") state and each select transistor STb is set into a non-selected (BLSO="L") state while the main column N is kept set in the selected state. Then, the memory cell blocks BLK which lie in the remotest portion from the sense amplifiers S/A are selected and the read operation is performed (data of each cell MC is previously erased). The control voltage BLCRL (VSS) is applied to the bit lines BLO0 to BLO7 connected to the cell transistors STb set in the non-selected state via the respective bias transistors BTb (bias selection lines BIASE="L" and BIASO="H").

Whether each of the main columns N, N+1, . . . is faulty or not is detected by checking whether any one of the bit lines BLE0 to BLE7 and BLO0 to BLO7 is open or not based on the read results thus obtained (the same operation is performed for the redundancy cell array).

Further, in the present embodiment, a bad bit line at the end of the bad column is detected by checking whether the bit lines BLE0 and BLO7 at the end of each of the main columns N, N+1, . . . are open or not (the same operation is performed for the redundancy cell array).

Figure 4:
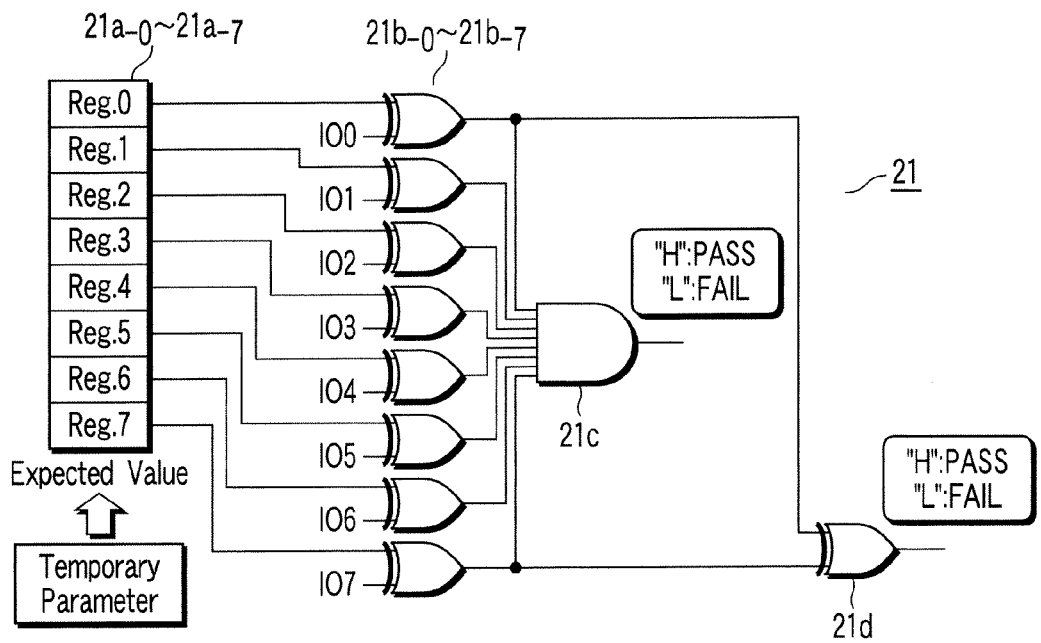
FIG. 4 is a circuit diagram showing an example of the configuration of a fault detection circuit in the NAND flash memory.

FIG. 4 shows an example of the configuration of the fault detection circuit 21 provided in the column control circuit 20. The fault detection circuit 21 is used to detect a bad column and a bad bit line at the end of the bad column by performing the bit line test. For example, the fault detection circuit 21 includes expected value storage registers (Reg.0 to Reg.7) 21a-0 to 21a-7, expected value comparison circuits 21b-0 to 21b-7, bad-column detection circuit 21c and end BL Pass/Fail detection circuit 21d.

The expected value storage registers 21a-0 to 21a-7 store expected values used to check whether any one of the bit lines BLE0 to BLE7 and BLO0 to BLO7 is open or not based on the read result obtained from each sense amplifier S/A for each column and "FF" is stored therein as the expected value.

The expected value comparison circuits 21b-0 to 21b-7 are configured by exclusive OR circuits and one-side input terminals of the circuits are supplied with expected values from the expected value storage registers 21a-0 to 21a-7. The read results obtained from the respective sense amplifiers S/A are supplied as IO data items IO0 to IO7 to the other input terminals of the expected value comparison circuits 21b-0 to 21b-7.

The bad-column detection circuit 21c is configured by an AND circuit and is used to detect a bad column based on the outputs of the expected value comparison circuits 21b-0 to 21b-7.

The end BL Pass/Fail detection circuit 21d is configured by an exclusive OR circuit and is used to detect a bad bit line at one side end of the bad column based on the outputs of the expected value comparison circuits 21b-0 and 21b-7 among the expected value comparison circuits 21b-0 to 21b-7.

In a case wherein whether the bit lines BLE0 and BLE7 lying on the end sides are open or not is checked, the bit line on one side end of the bad column which is open can be detected by checking the outputs of the expected value comparison circuits 21b-0 and 21b-7.

Further, when whether the bit line at the end portion which is open is even (BLE) or odd (BLO) can be determined, it is possible to precisely detect the bit line at one of the side ends which is open without being influenced by the arrangement of the bit lines. That is, it is possible to precisely detect the bit line at one of the side ends which is open for the column in which the arrangement of the bit lines BLE, BLO is reversed according to the form of the layout.

When the fault detection circuit 21 is formed with the configuration as described above, the bad-column RD repair operation is performed based on the output of the bad-column detection circuit 21c. For example, as shown in FIG. 2, if all of the bit lines BLO0 to BLO7 are normal when the bit lines BLO0 to BLO7 of the main column N are subjected to the open test, "1" is output from each of the expected value comparison circuits 21b-0 to 21b-7. Therefore, the output of the bad-column detection circuit 21c becomes "FF". That is, when the read results (IO data items IO0 to IO7) from the sense amplifiers S/A are all coincident with the expected values, there is no bit line which is open, and the output of the bad-column detection circuit 21c becomes "H (PASS)". On the other hand, even if one of the read results does not coincide with the expected value, there is a bad bit line (in the example of FIG. 2, bit line BL7) and the output of the bad-column detection circuit 21c becomes "L (FAIL)".

Further, the RD repair operation for the adjacent column adjacent to the bad bit line is performed based on the output of the end BL Pass/Fail detection circuit 21d. For example, as shown in FIG. 2, if the bit line BLO7 lying at the end is not open when the bit lines BLO0 to BLO7 of the main column N are subjected to the open test, "1" is output from the expected value comparison circuit 21b-0. Therefore, the output of the end BL Pass/Fail detection circuit 21d becomes "H (PASS)". On the other hand, if the bit line BLO7 lying at the end is open, "0" is output from the expected value comparison circuit 21b-0. As a result, the output of the end BL Pass/Fail detection circuit 21d becomes "L (FAIL)".

The above check (open test/short test) operation is repeatedly performed for the bit lines BLE0 to BLE7 and BLO0 to BLO7. Then, the RD repair operation for the bad column and the RD repair operation for the adjacent column are performed by use of the column RD repair circuit 22 by detecting the fault (FAIL) in any one of the tests for all of the columns.

Figure 5:
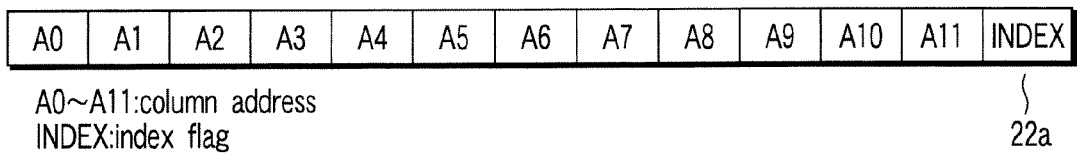
FIG. 5 is a diagram showing an example of the configuration of a column RD repair circuit in the NAND flash memory.

FIG. 5 shows an example of the configuration of the column RD repair circuit 22 provided in the column control circuit 20. The column RD repair circuit 22 is configured by a plurality of column RD registers 22a. By storing address data of a bad column from the column address register into the column RD register 22a, the RD repair operation for the bad column is performed by use of a corresponding one of the redundancy columns.

The column RD registers 22a each include areas A0 to A11 which store address data (for example, 12 bits) of a bad column and an area INDEX which stores an index flag (for example, 1 bit). The index flag indicates whether the column RD register 22a is effective or not and is set to the "H" level when address data is stored into the areas A0 to A11.

In the column RD register 22a, if a corresponding redundancy column becomes bad (bad redundancy column), the index flag is set to "H" and "1 (All 1)" is stored into all of the areas A0 to A11.

Figure 6:
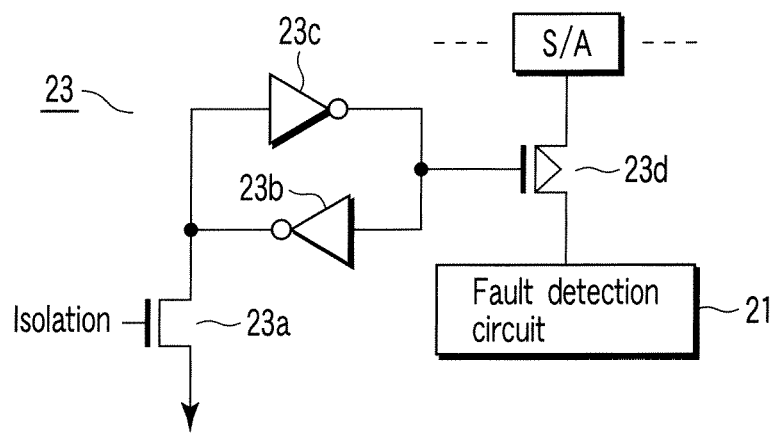
FIG. 6 is a circuit diagram showing an example of the configuration of a column RD isolation circuit in the NAND flash memory.

FIG. 6 shows an example of the configuration of the column RD isolation circuit 23 provided in the column control circuit 20. For example, the column RD isolation circuit 23 is provided between the expected value comparison circuits 21b-0 to 21b-7 of the fault detection circuit 21 and the sense amplifiers S/A of each column. The column RD isolation circuit 23 is used to electrically isolate the bad redundancy column, that is, to prevent the bad redundancy column from giving a bad influence to the bad-column checking operation in the other test by inhibiting access to the bad redundancy column.

That is, the column RD isolation circuit 23 includes an N-type MOS transistor 23a, inverter circuits 23b, 23c and P-type MOS transistor 23d as well as a column RD counter circuit and S/A isolation flag storage latch circuit (not shown), for example. The column RD isolation circuit 23 turns OFF the P-type MOS transistor 23d by setting an S/A isolation flag into the latch circuit. Thus, it isolates all of the sense amplifiers S/A of a corresponding redundancy column from the expected value comparison circuits 21b-0 to 21b-7.

Figure 7:
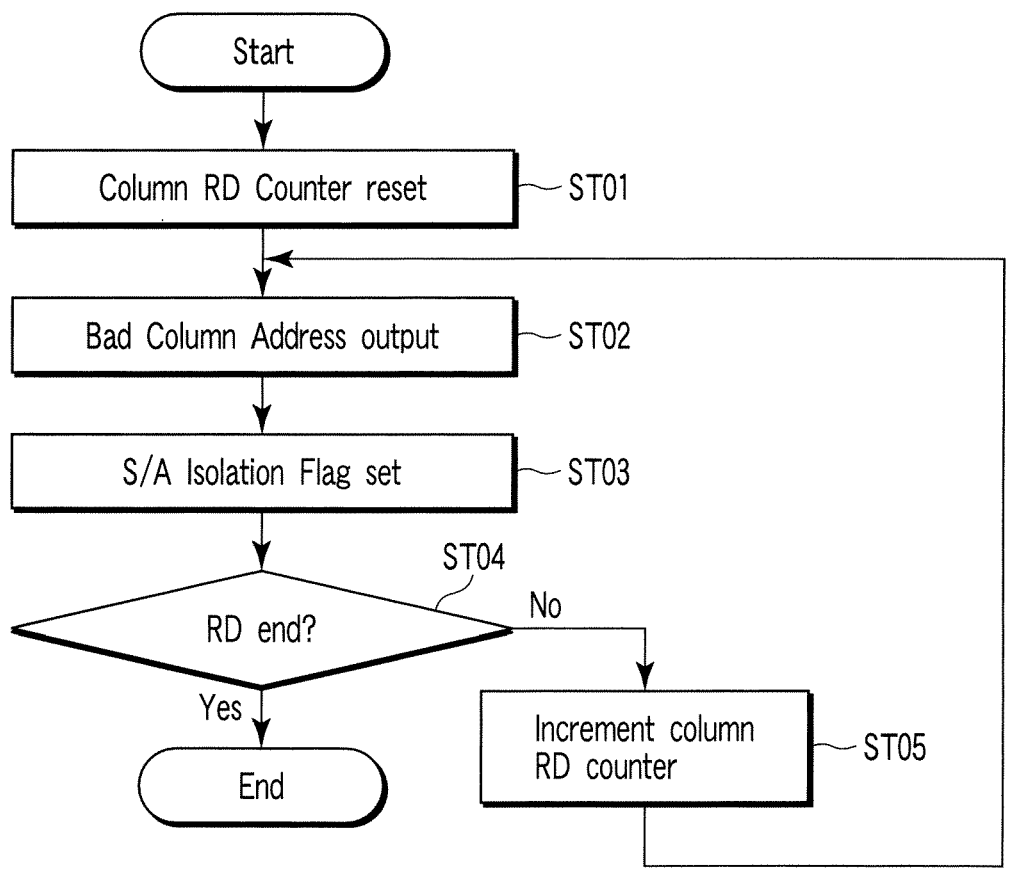
FIG. 7 is a flowchart for illustrating the operation of setting an S/A isolation flag of the column RD isolation circuit shown in FIG. 6.

FIG. 7 illustrates the operation of setting an S/A isolation flag of the column RD isolation circuit 23. For example, in a state in which the column RD counter circuit is reset (step ST01), address data of a bad column stored in the column RD register 22a is output (step ST02). Then, an S/A isolation flag "H" is set in the S/A isolation flag storage latch circuit (step ST03).

Further, if one of the column RD registers 22a which stores address data of the bad column is detected (step ST04), the count of the column RD counter circuit is incremented (step ST05) and then the process succeeding the step ST02 is repeatedly performed.

On the other hand, if the column RD registers 22a which stores address data of the bad column is not detected in the step ST04, the process is terminated as it is. After this, the process of isolating the bad redundancy column is performed according to the flag set in the latch circuit.

Next, in the NAND flash memory with the above configuration, the operation associated with the RD repair operation for the bad column is explained.

Figure 8:
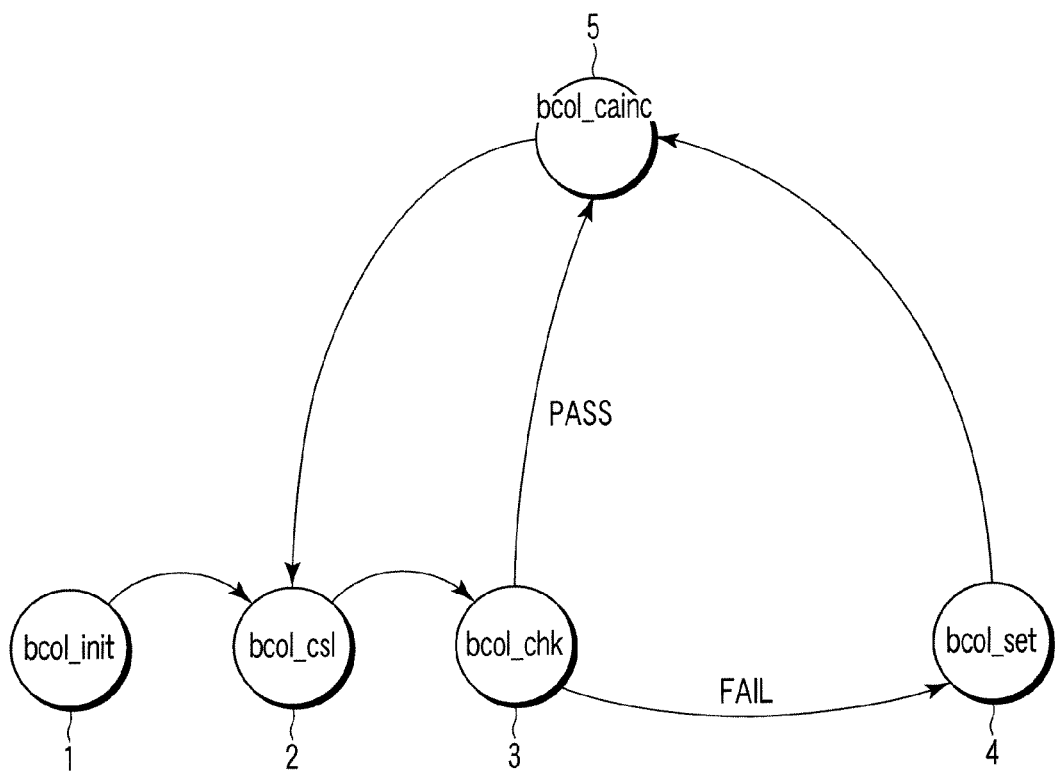
FIG. 8 is a diagram for illustrating a bad-column RD repair operation at the open test time.

FIG. 8 illustrates a bad-column RD repair operation. For example, data items of the bit lines BLE0 to BLE7 and BLO0 to BLO7 of each column are stored in the respective sense amplifiers S/A by performing the open test in the order of the redundancy cell array and memory cell array 10A. In this state, an initial column is selected (address data of the selected column is set into the column address register) to operate the column RD repair circuit 22.

Then, the column RD repair circuit 22 first performs the initialization operation of resetting the status and initializing the column RD registers (state 1/bcol_init).

After this, the data read operation for the selected column (the read operation of IO data items IO0 to IO7 from the respective sense amplifiers S/A of the selected column) is performed (state 2/bcol_csl).

Next, the read results (IO data items IO0 to IO7) are compared with the expected values of the expected value storage registers 21a-0 and 21a-7 by use of the expected value comparison circuits 21b-0 and 21b-7 (state 3/bcol_chk).

Then, the output of the bad-column detection circuit 21c is set to "L (FAIL)", that is, a fault of the selected column is detected. At this time, the address data is transferred from the column address register to the column RD register and the RD repair operation for the bad column is performed (state 4/bcol_set). After this, the state 5 is set.

On the other hand, if the output of the bad-column detection circuit 21c is set to "H (PASS)", that is, if a fault of the selected column is not detected, the address data of the selected column in the column address register is incremented (state 5/bcol_cainc). After this, the state 2 is set and the same process is performed for the next column.

Thus, the bad-column RD repair operation is performed for all of the main columns by repeatedly performing the above operation.

Figure 9:
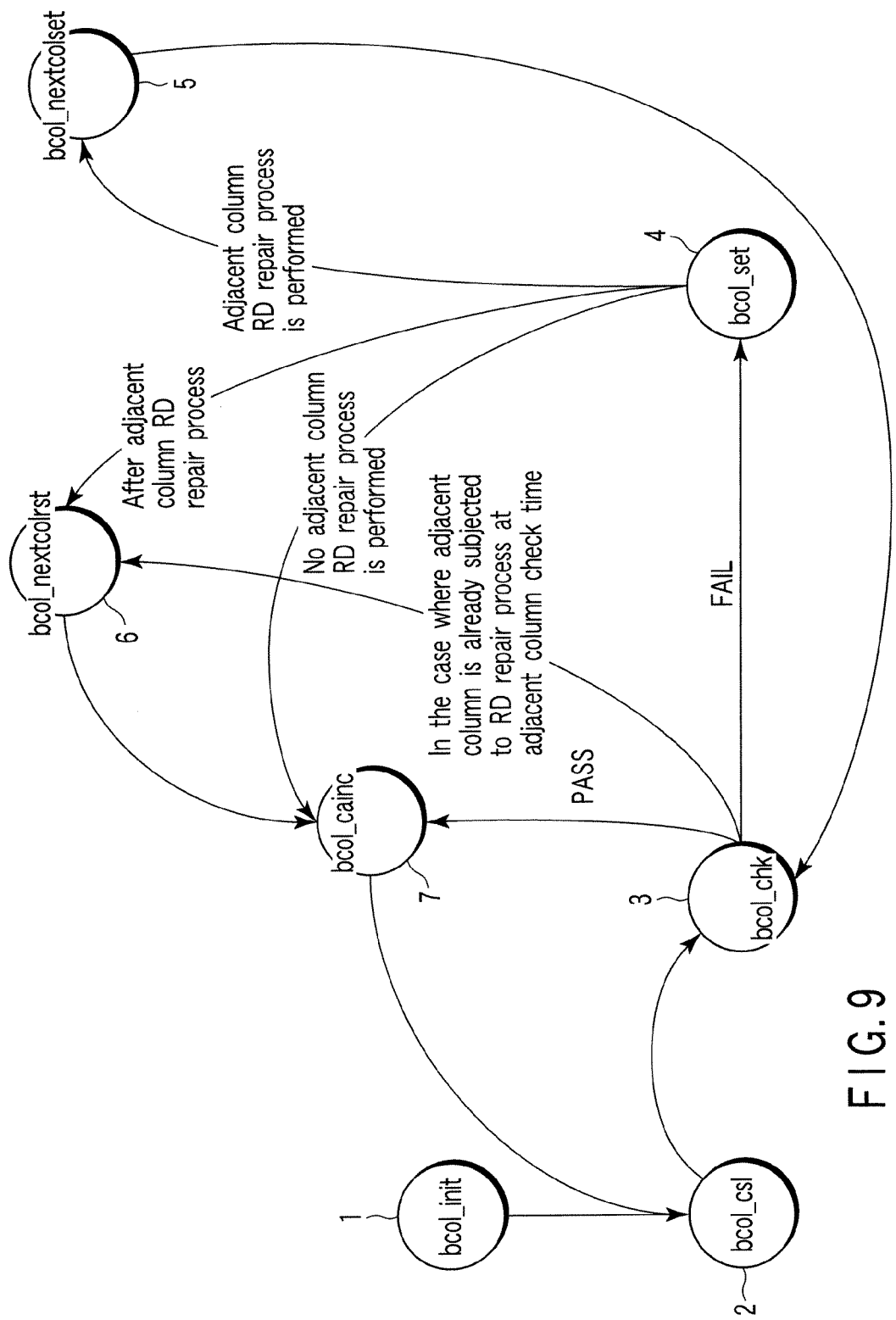
FIG. 9 is a diagram for illustrating a bad-column RD repair operation at the open test time which contains an RD repair operation for the adjacent column.

FIG. 9 illustrates a bad-column RD repair operation at the open test time which contains an RD repair operation for the adjacent column. In this example, for example, as shown in FIG. 2, a case wherein it is assumed that the bit line BLO7 of the main column N in the memory cell array 10A is open is explained.

As described above, when the bit line BLO7 of the main column N is open, the RD repair operation for the main column N is performed. Further, the RD repair operation for the adjacent column N+1 is performed in order to prevent miss-sensing in the main column (adjacent column) N+1 adjacent to the above column caused by the influence by the bit line BLO7 set in the floating state.

That is, in a state in which data items of the bit lines BLE0 to BLE7 or BLO0 to BLO7 of each column are stored in the sense amplifiers S/A, the initial column (main column N) is selected to operate the column RD repair circuit 22.

Then, the column RD repair circuit 22 first performs the initialization operation of resetting the status and initializing the column RD registers (state 1/bcol_init).

After this, the data read operation for the selected column (the read operation of IO data items IO0 to IO7 from the respective sense amplifiers S/A of the selected column) is performed (state 2/bcol_csl).

Next, the read results (IO data items IO0 to IO7) are compared with the expected values of the expected value storage registers 21a-0 and 21a-7 by use of the expected value comparison circuits 21b-0 and 21b-7 (state 3/bcol_chk).

Then, if the output of the bad-column detection circuit 21c is set to "H", that is, if a fault of the selected column is not detected, the state 7 is set.

On the other hand, if the output of the bad-column detection circuit 21c is set at "L", the address data thereof is transferred from the column address register to the column RD register and the bad-column RD repair operation is performed (state 4/bcol_set).

After the bad-column RD repair operation is performed, the output of the end BL Pass/Fail detection circuit 21d is checked. If the output of the end BL Pass/Fail detection circuit 21d is set at "L (FAIL)", address data of the adjacent column (main column N+1) is set into the column address register (state 5/bcol_nextcolset).

After this, the state 3 is set and if the output "L" of the bad-column detection circuit 21c is detected in the state 3/bcol_chk, the state is transited to the state 4/bcol_set and the RD repair operation for the adjacent column is performed.

That is, when the selected column is the main column N, the RD repair operation for the main column N is performed, and at the same time, the RD repair operation for the main column N+1 adjacent thereto on the side of the bit line BLO7 which is open is performed.

In this case, however, even when the output of the bad-column detection circuit 21c is set at "L" and if the selected column is already subjected to the RD repair operation, the RD repair operation for the bad column is not performed at this time (to the state 6/bcol_nextcolrst). That is, in a case where the RD repair operation for the bad column containing the RD repair operation for the adjacent column is performed, the column now selected is already subjected to the RD repair operation as the adjacent column in some cases when the RD repair operation for the bad column using a different column as the selected column is performed. In this case, even if it is the bad column, the RD repair operation is not performed. Thus, it is possible to suppress useless usage of the redundancy column.

Next, since data in the column address register is address data of the adjacent column N+1 after the RD repair operation for the adjacent column is performed, the data is restored to address data of the main column N (state 6/bcol_nextcolrst).

Thus, the RD repair operations for the bad column and adjacent column are terminated and the next column is checked (to the state 7/bcol_cainc).

By performing the above operation, the operation can be easily attained without drastically changing the column RD repair circuit which has been used so far.

Further, when the adjacent column is not provided, that is, in the case of an end column which does not have an adjacent column on one side like the $1^{st}$ column and last column, an end bit line (for example, the bit line BLE0 of the main column N) lying on the side on which the adjacent column is not provided is treated as an object which is not subjected to the RD repair operation for the adjacent column only when the end bit line is open (to the state 7/bcol_cainc).

Likewise, in a device in which a wiring such as a shunt is provided, the influence by miss-sensing due to a bad bit line lying at the end between the columns adjacent to the wiring is small, and therefore, the bit line lying at the end on the side adjacent to the wiring can be treated as an object which is not subjected to the RD repair operation for the adjacent column only when the bit line is open (to the state 7/bcol_cainc). Also, in this case, useless usage of the redundancy column can be suppressed.

Further, it is not necessary to perform the RD repair operation for the adjacent column in the case of columns in which the wiring-wiring distance of the bit lines is sufficiently large. Also, in this case, the bit line may be treated as an object which is not subjected to the RD repair operation in order to suppress useless usage of the redundancy column (to the state 7/bcol_cainc).

In the state 6, address data of the adjacent column is reset as described above and the state 7 is set.

In the state 7, the state 2 is set after address data of the selected column in the column address register is incremented and the same operation is performed for the next column. In this case, if the next column is already subjected to the RD repair operation, the same operation may be performed for the column after the next column.

Thus, by repeatedly performing the above operation, the RD repair operation for the adjacent column for all of the columns is performed. At the same time, when the bit line lying at the end of the selected column is open, the RD repair operation for the adjacent column lying on the side of the bit line which is open is performed.

As described above, the bad column is repaired or replaced by the redundancy column in a self-test fashion (automatically) for the selected column. At this time, if the bit line lying at the end of the bad column is bad, the adjacent column on the bad bit line side is also automatically repaired or replaced by the redundancy column. That is, the RD repair function for the bad column containing the RD repair function for the adjacent column is provided on the device as a BIST function. Thus, a plurality of devices can be simultaneously measured without using a high-performance tester. Therefore, the RD repair operation for the adjacent column can be automatically performed, the test time can be shortened and the test cost can be lowered.

The above case is not limited to a case wherein the bit line at the end of the column is open, and the RD repair operation for the adjacent column may be performed according to whether the bit line which is different from the end bit line and affects the adjacent column is open or not depending on the layout (for example, the distance between the wirings of the bit lines).

SECOND EMBODIMENT

Figure 10:
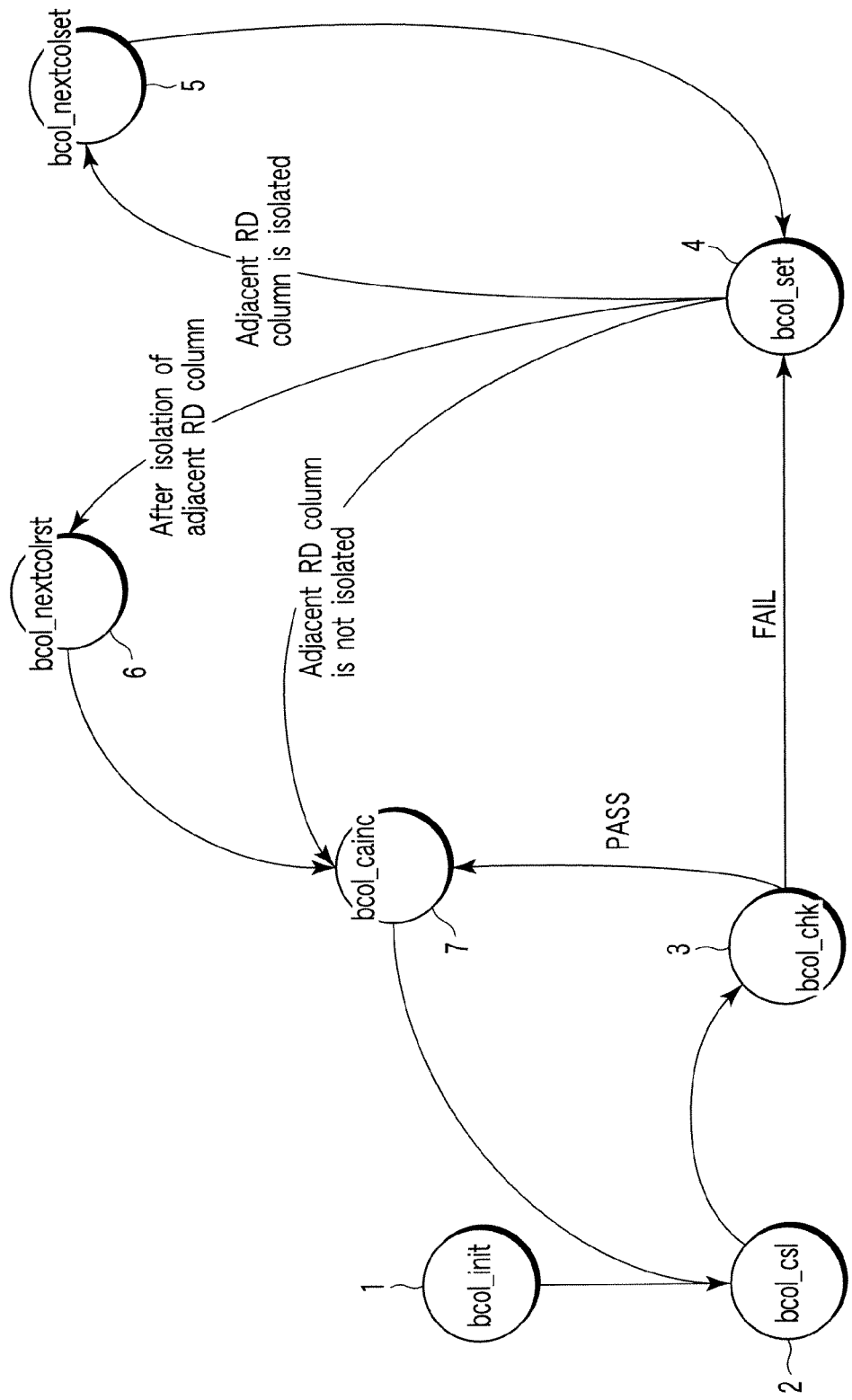
FIG. 10 is a diagram for illustrating a bad redundancy column isolation operation at the open test time according to a second embodiment of this invention.

FIG. 10 illustrates an isolation operation for a bad redundancy column at the open test time in a semiconductor memory device according to a second embodiment of this invention. In the present embodiment, a NAND flash memory (refer to FIG. 1), which is a nonvolatile semiconductor memory device, is taken as an example and the isolation operation for the bad redundancy column containing an adjacent redundancy column isolation operation at the bit line test (open test) time for the redundancy column is explained (the bad redundancy column is not repaired but isolated). The open test for the redundancy column is the same as the open test for the main column described in the first embodiment. Further, when the isolation operation for the bad redundancy column is already performed for all of the redundancy columns and the bit line at the end of the selected redundancy column is open, in the following explanation, it is assumed that the isolation operation of the bad redundancy column lying on the side of the bit line which is open is already performed.

That is, in the redundancy column checking operation (RD column check) for the redundancy cell array, it is assumed that data items of the bit lines BLE0 to BLE7 and BLO0 to BLO7 of the respective redundancy columns are stored in the respective sense amplifiers S/A. In this state, a column RD repair circuit 22 is operated.

Then, the column RD repair circuit 22 first performs the initialization operation of resetting the status and initializing column RD registers (state 1/bcol_init).

After this, an initial redundancy column is selected (address data of the selected redundancy column is set in the column RD register) and the data read operation for the selected redundancy column (the read operation of IO data items IO0 to IO7 from the respective sense amplifiers S/A of the selected redundancy column) is performed (state 2/bcol_csl).

Next, the read results (IO data items IO0 to IO7) are compared with expected values of expected value storage registers 21a-0 and 21a-7 by use of expected value comparison circuits 21b-0 and 21b-7 (state 3/bcol_chk).

Then, if the output of the bad-column detection circuit 21c is set to "H (PASS)", that is, if a fault of the selected redundancy column is not detected, the state 7 (bcol_cainc) is set.

Further, if the output of the bad-column detection circuit 21c is set to "L (FAIL)", the selected redundancy column is isolated (state 4/bcol_set). After this, when the adjacent redundancy column is isolated, the state 5 (bcol_nextcolset) is set.

In the state 4, "all 1" is set in the column RD register in which address data of the selected redundancy column which becomes bad is stored. In the state 5, address data of the adjacent redundancy column is set in the column RD register. After this, the state is returned to the state 4 again, "all 1" is set in the column RD registers and the isolation operation is completed.

In the state 6, address data of the original selected redundancy column is set into the column RD register in which address data of the adjacent redundancy column is set and then the state 7 is set.

In the state 7, address data of the selected redundancy column in the column RD register is incremented, then the state 2 is set and the same process is performed for the next redundancy column. In this case, if the next redundancy column is already isolated, the same process may be performed for the redundancy column after the next redundancy column.

Thus, by repeatedly performing the above operation, the bad redundancy column is isolated for all of the redundancy columns. Further, when the bit line lying at the end of the selected redundancy column is open, the adjacent redundancy column lying on the side of the bit line which is open is isolated. At the same time, when the bit line lying at the end of the repaired redundancy column is open, the repaired bad redundancy column is isolated and the repaired adjacent redundancy column lying on the side of the bit line which is open is isolated. As a result, it becomes possible to securely attain a highly precise operation.

When a certain redundancy column becomes bad and if the redundancy column is already isolated, address data thereof is transferred to another column RD register and then the redundancy column may be isolated. Likewise, when a certain adjacent redundancy column is isolated and if the adjacent redundancy column is already isolated, address data thereof is transferred to another column RD register and then the adjacent redundancy column may be isolated.

Further, when data is already stored in the adjacent redundancy column, the redundancy column is isolated after the data is transferred to another redundancy column so as to protect original data.

THIRD EMBODIMENT

Figure 11:
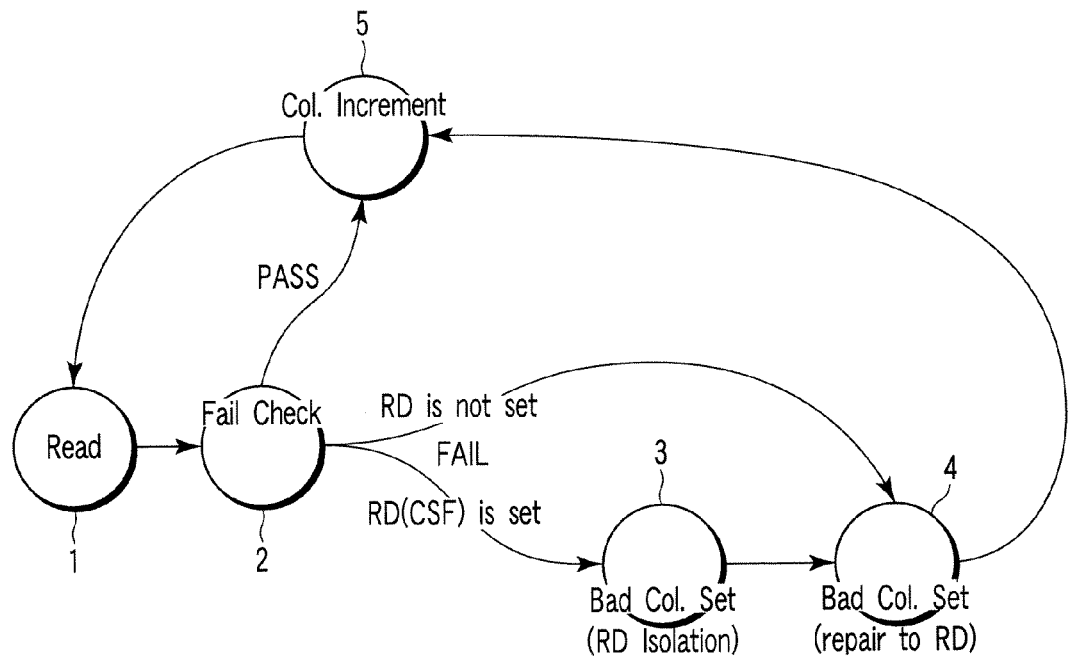
FIG. 11 is a diagram for illustrating a bad-column isolation operation at the bit line test time according to a third embodiment of this invention.

FIG. 11 illustrates a bad-column isolation operation at the bit line test time in a semiconductor memory device according to a third embodiment of this invention. In this example, a case wherein a NAND flash memory (refer to FIG. 1) which is a nonvolatile semiconductor memory device is taken as an example and a problem caused by the multiple repair operation due to usage of the same address of the redundancy column at the open test and/or short test time for the main column is prevented is explained.

Figure 12:
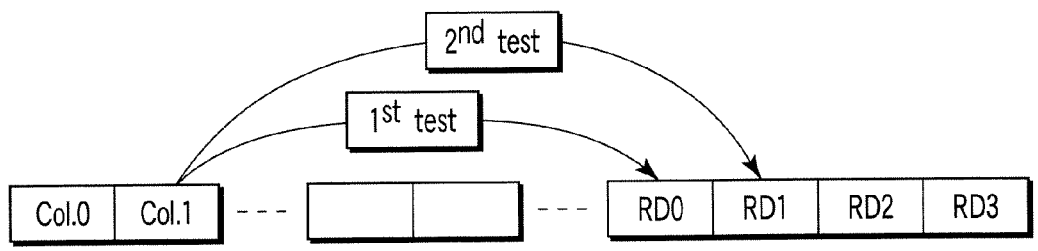
FIG. 12 is a diagram for illustrating a multiple address selection operation at the bit line test time.

For example, as shown in FIG. 12, it is assumed that the main column Col.1 is isolated by the redundancy column RD0 as an adjacent column in the prior bit line test ($1^{st}$ test). In this state, if the main column Col.1 which is already isolated becomes bad in the succeeding bit line test ($2^{nd}$ test), address data of the bad column Col.1 will be set into the column RD register of the redundancy column RD1, and therefore, there occurs a possibility that multiple address selection occurs.

In order to avoid the above problem, for example, as shown in FIG. 11, when address data of the selected column is already stored in a certain column RD register (CSF is set), the redundancy column is isolated (state 3) and then address data of the selected column is set into the column RD register of a new redundancy column (state 4). Thus, occurrence of multiple address selection caused by the multiple repair operation by use of the same address for the redundancy column can be prevented.

In each of the above embodiments, the adjacent column can be automatically isolated when the main column and redundancy column are arranged adjacent to each other.

Of course, the configuration of the NAND flash memory is not limited to the configurations described in the respective embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array having a plurality of main columns, the plurality of main columns each having a plurality of bit lines, and a plurality of memory cells that are connected to the plurality of bit lines, respectively;
a redundancy cell array having a plurality of redundancy columns, the plurality of redundancy columns each having a plurality of bit lines, and a plurality of redundancy cells that are connected to the plurality of bit lines, respectively;
a plurality of sense amplifiers connected to each of the plurality of bit lines of the memory cell array and the plurality of bit lines of the redundancy cell array, each of the plurality of sense amplifiers reading out data of the plurality of memory cells or the plurality of redundancy cells through the plurality of bit lines;
a detection circuit which detects, based on the data read out by the plurality of sense amplifiers, a bad bit line at an end of a bad column of the memory cell array; and
a repair circuit which repairs the bad column of the memory cell array by use of the plurality of redundancy columns and repairs an adjacent column which lies adjacent to the bad column on the bad bit line side detected by the detection circuit by use of the plurality of redundancy columns.

2. The semiconductor memory device according to claim 1, wherein the repair circuit does not treat the adjacent column as a to-be-repaired object when the adjacent column lying on the bad bit line side detected by the detection circuit is already repaired by use of the plurality of redundancy columns.

3. The semiconductor memory device according to claim 1, wherein the adjacent column is not treated as an object to be repaired by the repair circuit when the adjacent column does not lie on the bad bit line side detected by the detection circuit.

4. The semiconductor memory device according to claim 1, wherein the repair circuit repairs the bad redundancy column of the redundancy cell array by use of a different redundancy column.

5. The semiconductor memory device according to claim 4, wherein the repair circuit repairs the bad redundancy column by use of a different redundancy column after the bad redundancy column is isolated from the redundancy cell array.

6. The semiconductor memory device according to claim 1, further comprising an isolation circuit which electrically isolates the bad redundancy column of the redundancy cell array from the redundancy cell array.

7. The semiconductor memory device according to claim 6, wherein the isolation circuit inhibits access to the bad redundancy column.

8. The semiconductor memory device according to claim 1, wherein a built-in self-test (BIST) function is provided on a chip.

9. The semiconductor memory device according to claim 8, wherein at least one of a bit line open test and bit line short test is performed by use of the built-in self-test function.

10. The semiconductor memory device according to claim 1, wherein the repair circuit repairs the bad column of the memory cell array after repairing the bad redundancy column of the redundancy cell array.

11. A semiconductor memory device comprising:
a memory cell array section including a memory cell array having a plurality of main columns in which a plurality of memory cells are arranged in column units, and a redundancy cell array having a plurality of redundancy columns in which a plurality of redundancy cells are arranged in column units, the plurality of main columns each having a plurality of bit lines, and a predetermined number of memory cells that are connected to the plurality of bit lines, respectively, and the plurality of redundancy columns each having a plurality of bit lines, and a predetermined number of redundancy cells that are connected to the plurality of bit lines, respectively;
a plurality of sense amplifiers connected to each of the plurality of bit lines of the memory cell array and the plurality of bit lines of the redundancy cell array, each of the plurality of sense amplifiers reading out data of the plurality of memory cells or the plurality of redundancy cells through the plurality of bit lines;
a detection circuit which detects, based on the data read out by the plurality of sense amplifiers, a bad bit line at an end of a bad column of the memory cell array;
a repair circuit which repairs the bad column of the memory cell array by use of the plurality of redundancy columns and repairs an adjacent column which lies adjacent to the bad column on the bad bit line side detected by the detection circuit by use of the plurality of redundancy columns of the redundancy cell array; and an isolation circuit which electrically isolates the bad redundancy column of the redundancy cell array from the redundancy cell array.

12. The semiconductor memory device according to claim 11, wherein the repair circuit does not treat the adjacent column as a to-be-repaired object when the adjacent column lying on the bad bit line side detected by the detection circuit is already repaired by use of the plurality of redundancy columns.

13. The semiconductor memory device according to claim 11, wherein the adjacent column is not treated as an object to be repaired by the repair circuit when the adjacent column does not lie on the bad bit line side detected by the detection circuit.

14. The semiconductor memory device according to claim 11, wherein the repair circuit repairs the bad redundancy column by use of a different redundancy column after the isolation circuit isolates the bad redundancy column from the redundancy cell array.

15. The semiconductor memory device according to claim 11, wherein the isolation circuit inhibits access to the bad redundancy column.

16. The semiconductor memory device according to claim 11, wherein a built-in self-test (BIST) function is provided on a chip.

17. The semiconductor memory device according to claim 16, wherein at least one of a bit line open test and bit line short test is performed by use of the built-in self-test function.

18. The semiconductor memory device according to claim 11, wherein the isolation circuit isolates a bad redundancy column and isolates an adjacent redundancy column on the side of a bit line which is open when the bit line lying at an end of the bad redundancy column is open.

* * * * *